(12) United States Patent
Hojabri

(10) Patent No.: US 6,236,269 B1
(45) Date of Patent: May 22, 2001

(54) COMPLEMENTARY CMOS DIFFERENTIAL AMPLIFIER CIRCUIT

(75) Inventor: Peyman Hojabri, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/413,925

(22) Filed: Oct. 7, 1999

(51) Int. Cl.[7] .................................................. H03F 3/45
(52) U.S. Cl. ............................................. 330/253; 330/257
(58) Field of Search .................................. 330/253, 257, 330/261

(56) References Cited

U.S. PATENT DOCUMENTS

| | | | |
|---|---|---|---|
| 4,797,631 | * 1/1989 | Hsu et al. | 330/253 |
| 5,631,607 | * 5/1997 | Huijsing et al. | 330/253 |
| 5,714,906 | * 2/1998 | Motamed et al. | 327/563 |
| 5,894,245 | * 4/1999 | Cho | 330/253 |
| 5,907,259 | * 5/1999 | Yamada et al. | 327/563 |

\* cited by examiner

*Primary Examiner*—Robert Pascal
*Assistant Examiner*—Henry Choe
(74) *Attorney, Agent, or Firm*—Baker & McKenzie

(57) ABSTRACT

A complementary metal oxide semiconductor (CMOS) differential amplifier circuit uses complementary CMOS differential amplifier circuits connected in parallel at the differential input to generate a push-pull output signal with a charge pump circuit. The NMOS and PMOS input stages drive dual PMOS and NMOS current mirror circuits, respectively. One of each of the dual PMOS and NMOS current mirror circuits are used together to form the output charge pump circuit, while the remaining PMOS and NMOS current mirror circuits are cross-connected to provide PMOS-origin and NMOS-origin input currents to the output NMOS and PMOS current mirror circuits, respectively. Each of the circuit branches has an equal number of CMOS transistors connected between the power supply terminals. This complementary circuit structure provides numerous advantages: inherent compensation for NMOS and PMOS temperature coefficients; compact circuit structure between the power supply terminals; avoidance of cascode circuitry; and good slew rate since the NMOS and PMOS devices provide complementary strengths in terms of their respective current drive capabilities.

22 Claims, 2 Drawing Sheets

COMPLEMENTARY CMOS DIFFERENTIAL AMPLIFIER CIRCUIT

BACKGROUND OF THE INVENTION

1. Field of the Invention

The present invention relates to differential amplifier circuits, and in particular, to differential amplifier circuits implemented with complementary metal oxide semiconductor (CMOS) transistors in compact circuit structures which require no input signal terminal biasing while also providing substantially symmetrical dynamic input signal range.

2. Description of the Related Art

Referring to FIG. 1, conventional CMOS differential amplifiers typically use a stacked, or telescopic circuit structure in which multiple CMOS transistors are connected in series between the power supply terminals VDD, VSS/GND. The upper NMOS transistors M1, M2 are biased with a predetermined bias voltage Vbias to establish current flow and a nominal voltage potential for the terminal providing the output voltage Vout. The complementary PMOS transistors M3, M4 and NMOS transistors M5, M6 are biased at their drain terminals with a selected DC bias to establish the nominal center potential for the complementary phases Ip, Im of the differential input signal Ip-Im. A tail current transistor M7, biased by another bias voltage Vtail, establishes the tail current shared by the two circuit branches.

This conventional design has several disadvantages. One is that the input circuitry requires a DC bias to ensure that the differential input signal components are properly centered for maximum dynamic input signal range. Another is that the telescopic arrangement of the individual transistors causes the circuit to be more sensitive to temperature variations due to the resultant increased overall temperature coefficient. Additionally, particularly due to the various biasing potentials required, this circuit is very sensitive to variations in the power supply potential VDD-VSS/GND.

SUMMARY OF THE INVENTION

A complementary metal oxide semiconductor (CMOS) differential amplifier circuit in accordance with a preferred embodiment of the present invention uses complementary CMOS differential amplifier circuits connected in parallel at the differential input to generate a push-pull output signal with a charge pump circuit. The NMOS and PMOS input stages drive dual PMOS and NMOS current mirror circuits, respectively. One of each of the dual PMOS and NMOS current mirror circuits are used together to form the output charge pump circuit, while the remaining PMOS and NMOS current mirror circuits are cross-connected to provide PMOS-origin and NMOS-origin input currents to the output NMOS and PMOS current mirror circuits, respectively. Each of the circuit branches has an equal number of CMOS transistors connected between the power supply terminals. This complementary circuit structure provides numerous advantages: inherent compensation for NMOS and PMOS temperature coefficients; compact circuit structure between the power supply terminals; avoidance of cascode circuitry; and good slew rate since the NMOS and PMOS devices provide complementary strengths in terms of their respective current drive capabilities.

In accordance with one embodiment of the present invention, a complementary metal oxide semiconductor (CMOS) differential amplifier circuit includes power supply terminals, input signal terminals, an output signal terminal and a plurality of complementary CMOS differential amplifier circuits. The input signal terminals are configured to convey a differential input signal and the output signal terminal is configured to convey an output signal. The plurality of complementary CMOS differential amplifier circuits, coupled between the power supply terminals and the output signal terminal and coupled in parallel to the input signal terminals, is configured to receive the differential input signal and in accordance therewith provide the output signal. The plurality of complementary CMOS differential amplifier circuits forms a plurality of circuit branches and each one of the plurality of circuit branches includes an equal number of CMOS transistors coupled between the power supply terminals.

In accordance with another embodiment of the present invention, a complementary metal oxide semiconductor (CMOS) differential amplifier circuit includes power supply terminals, input signal terminals, an output signal terminal, and differential amplifier circuits. The input signal terminals are configured to convey a differential input signal and the output signal terminal is configured to convey an output signal. One differential amplifier circuit is configured to receive the differential input signal and in accordance therewith provide a portion of the output signal, and includes an NMOS input stage coupled between the input signal terminals and a PMOS output stage coupled between the NMOS input stage and the output signal terminal. Another differential amplifier circuit is configured to receive the differential input signal and in accordance therewith provide another portion of the output signal, and includes a PMOS input stage coupled between the first and second input signal terminals and an NMOS output stage coupled between the PMOS input stage and the output signal terminal.

In accordance with still another embodiment of the present invention, a complementary metal oxide semiconductor (CMOS) differential amplifier circuit includes:

first and second power supply means for conveying electrical power;

first and second input signal means for conveying a differential input signal;

output signal means for conveying an output signal; and a plurality of complementary CMOS differential amplifier means, coupled between the first and second power supply means and the output signal means and coupled in parallel to the first and second input signal means, for receiving the differential input signal and in accordance therewith providing the output signal;

wherein the plurality of complementary CMOS differential amplifier means forms a plurality of circuit branches and each one of the plurality of circuit branches includes an equal number of CMOS transistors coupled between the first and second power supply means.

In accordance with yet another embodiment of the present invention, a complementary metal oxide semiconductor (CMOS) differential amplifier circuit includes:

first and second power supply means for conveying electrical power;

first and second input signal means for conveying a differential input signal;

output signal means for conveying an output signal;

first differential amplifier means for receiving the differential input signal and in accordance therewith providing a portion of the output signal and including NMOS input means coupled between the first and second input signal means, and PMOS output means coupled between the NMOS input means and the output signal means; and second differential amplifier means for receiving the differential input signal and in accordance therewith providing another portion of the output signal and including PMOS input means coupled between the first and second input signal means, and NMOS output means coupled between the PMOS input means and the output signal means.

These and other features and advantages of the present invention will be understood upon consideration of the following detailed description of the invention and the accompanying drawings.

DETAILED DESCRIPTION OF THE INVENTION

Figure 2:
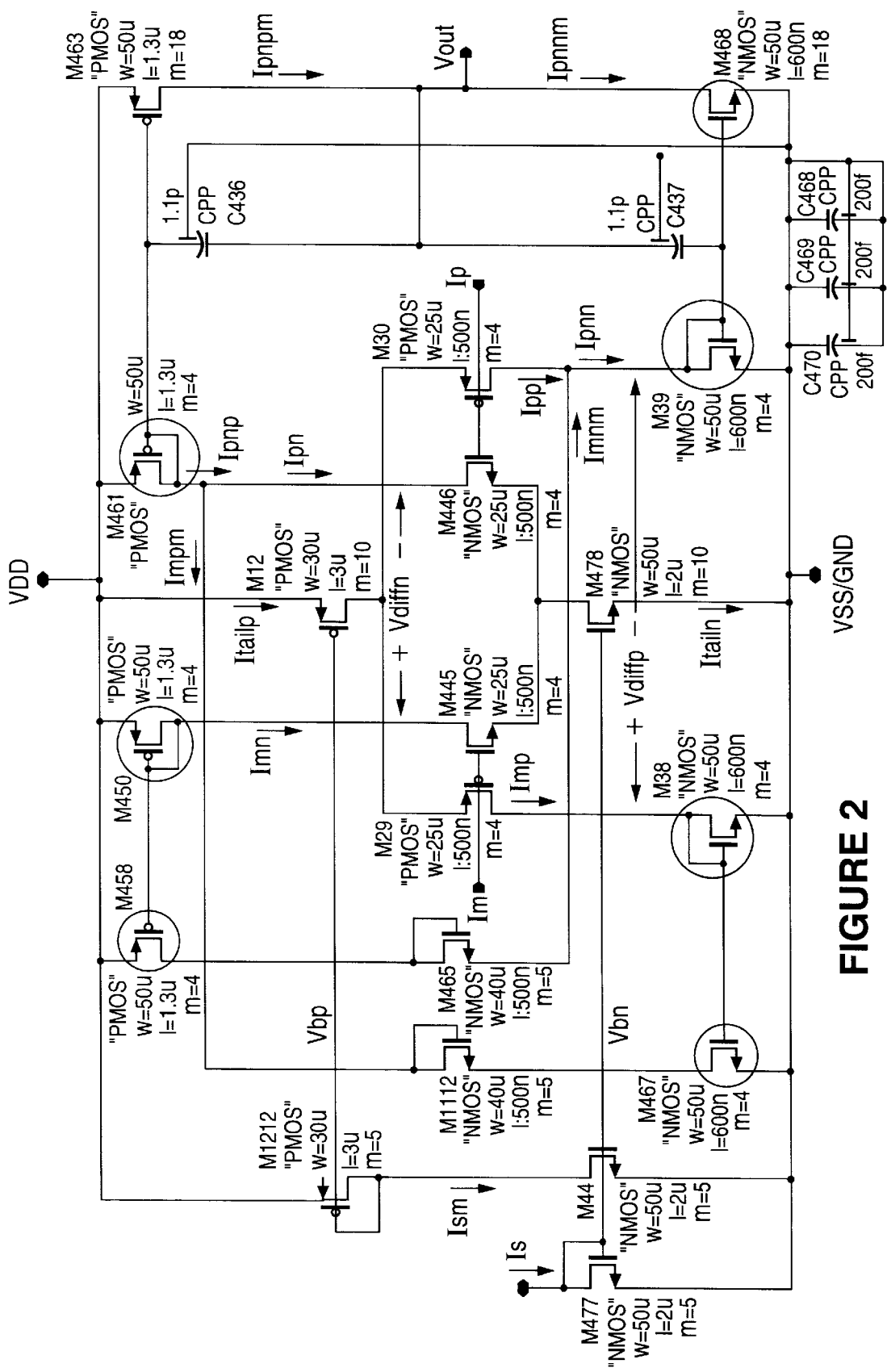
FIG. 2 is a schematic diagram of a CMOS differential amplifier circuit in accordance with one embodiment of the present invention.

Referring to FIG. 2, a CMOS differential amplifier circuit in accordance with one embodiment of the present invention uses complementary CMOS differential amplifier circuits and complementary current mirror circuits interconnected substantially as shown to convert a differential input signal voltage Ip-Im to a single-ended output voltage Vout. Complementary CMOS differential amplifier circuits receive and process the input signal Ip-Im, while current source and sink circuits, connected in a push-pull arrangement, provide the single-ended output voltage Vout.

Two differential amplifiers are connected in parallel at the input to receive the two phases Ip, Im of the differential input signal Ip-Im. Each differential amplifier has an input stage formed with two MOS transistors connected in a differential configuration, along with another MOS transistor connected as a tail current source. The individual phases of the differential output voltage formed at the drain terminals of the input transistors drive an output stage in the form of two separate current replication, or mirror, circuits. The current mirror circuits in one output stage are cross-connected with the current mirror circuits in the other output stage. One current mirror circuit from one output stage serves as a current source for the output terminal, while another current mirror circuit from the other output stage serves as a current sink circuit for the output terminal. These current source and sink circuits drive the output terminal in a push-pull configuration.

One of the differential amplifiers has an NMOS input stage which includes transistors M445 and M446 as the differential input pair and transistor M478 as the tail current source. A PMOS output stage is formed by two current mirror circuits: one formed by transistors M450 and M458; another formed by transistors M461 and M463. When a differential input voltage Ip-Im is applied, a differential voltage Vdiffn is produced at the drain terminals of transistors M445 and M446. The tail current Itailn is split to form differential branch currents Ipn and Imn. Current Imn is replicated, or mirrored, to produce current Imnm through diode-connected transistor M465.

The other differential amplifier has a PMOS input stage which includes transistors M29 and M30 as the differential input pair and transistor M12 as the tail current source. An NMOS output stage is formed by two current mirror circuits: one formed by transistors M38 and M467; another formed by transistors M39 and M468. Application of the differential input voltage Ip-Im at the input terminals causes a differential voltage Vdiffp to be formed at the drain terminals of transistors M29 and M30. The tail current Itailp is split to form differential branch currents Ipp and Imp. Current Imp is mirrored to produce current Impm through diode-connected transistor M1112.

A bias voltage generator circuit is formed by another current mirror circuit which includes transistors M477, M44 and M1212. A source current Is is mirrored to form current Ism which establishes bias voltages Vbp and Vbn for tail current source transistors M12 and M478, respectively.

Differential branch current Ipn and mirrored differential branch current Impm sum together at the drain terminal of transistor M461 to form current Ipnp. This current Ipnp is mirrored to produce current Ipnpm as a source current to the output terminal. Similarly, differential branch current Ipp and mirrored differential branch current Imnm sum together at the drain terminal of transistor M39 to form current Ipnn. This current Ipnn is mirrored to produce current Ipnnm as a sink current for the output terminal. The sum of these source Ipnpm and sink Ipnnm currents causes an output voltage Vout to be produced at the output terminal.

Figure 1:
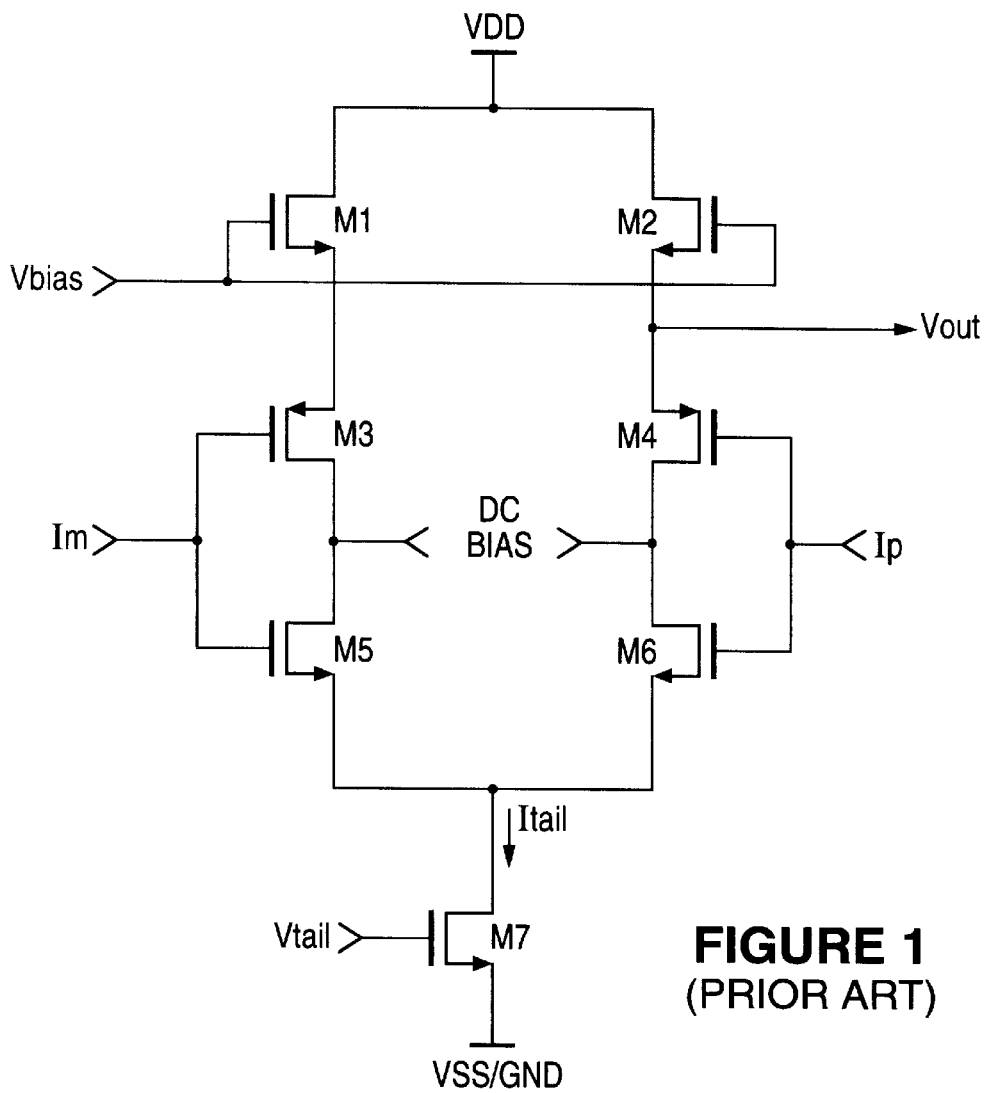
FIG. 1 is a simplified schematic diagram of a conventional CMOS differential amplifier circuit.
Figure 3:
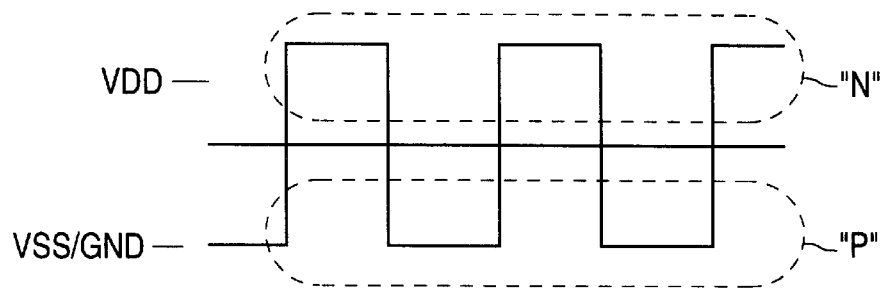
FIG. 3 is a signal diagram representing the improved slew rate provided by the circuit of FIG. 2 due to the use of complementary CMOS differential amplifier circuits.

This circuit structure provides a number of advantages. One advantage is inherent compensation at the input terminal. By using both PMOS (M29 and M30) and NMOS (M445 and M446) transistors to provide the initial amplification of the input signal Ip-Im, an improved slew rate can be achieved due to the complementary signal response characteristics of NMOS and PMOS transistors at opposing input signal polarities (see FIG. 3). Additionally, each of the various amplifier circuit branches between the power supply terminals VDD, VSS/GND includes an equal number of CMOS transistors. For example, one circuit branch defined as that traceable through transistors M450, M445 and M478 has three CMOS transistors, i.e., one PMOS and two NMOS transistors. Similarly, the circuit branch defined by tracing through transistors M12, M29 and M38 also has three CMOS transistors, i.e., one NMOS and two PMOS transistors. (Inclusion of diode-connected transistors M1112 and M465 ensure that this characteristic is maintained throughout.) This use of complementary transistor types makes the circuit more compact, avoids the need for any cascode circuitry and allows a maximum dynamic input signal range to be maintained without the need for separate DC biasing of the input terminals.

Furthermore, due to this consistent use of complementary MOS transistor types, the temperature coefficients of the various PMOS and NMOS devices tend to cancel one another, thereby making this circuit less sensitive to variations in the power supply potential VDD-VSS/GND. This self-cancellation of temperature coefficients is further enhanced by the use of both PMOS-origin and NMOS-origin currents to produce the source Ipnpm and sink Ipnnm currents at the output terminal. For example, branch current Ipn is an NMOS-origin current due to the action of NMOS transistor M446, while mirrored branch current Impm is a PMOS-origin current due to the action of PMOS transistor M29. Hence, current Ipnp includes both an NMOS-origin component (Ipn) and a PMOS-origin component (Impm), as does its mirrored counterpart source current Ipnpm provided to the output terminal. Similarly, branch current Ipp is of PMOS origin due to the action of PMOS transistor M30, while mirrored branch current Imnm is of NMOS origin due to the action of NMOS transistor M445. Hence, current Ipnn has a PMOS-origin component (Ipp) and an NMOS-origin component (Imnm), as does its mirrored counterpart sink current Ipnnm provided to the output terminal.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a complementary metal oxide semiconductor (CMOS) differential amplifier circuit, comprising:
   first and second power supply terminals;
   first and second input signal terminals for conveying a differential input signal;
   an output signal terminal for conveying an output signal formed by a sum of an output source current and an output sink current; and
   a plurality of complementary CMOS differential amplifier circuits, coupled between said first and second power supply terminals and said output signal terminal and coupled in parallel to said first and second input signal terminals, that following reception of said differential input signal provide said output source and sink currents;
   wherein said plurality of complementary CMOS differential amplifier circuits forms a plurality of circuit branches, each one of said plurality of circuit branches includes an equal number of CMOS transistors coupled between said first and second power supply terminals, and each one of said output source and sink currents includes both PMOS-origin and NMOS-origin current components generated in response to said differential input signal.

2. The apparatus of claim 1, wherein said plurality of complementary CMOS differential amplifier circuits comprises:
   a first differential amplifier circuit which includes
      an NMOS input stage coupled between said first and second input signal terminals, and
      a PMOS output stage coupled between said NMOS input stage and said output signal terminal; and
   a second differential amplifier circuit which includes
      a PMOS input stage coupled between said first and second input signal terminals, and
      an NMOS output stage coupled between said PMOS input stage and said output signal terminal.

3. The apparatus of claim 2, wherein:
   said NMOS input stage includes
      first and second NMOS transistors, coupled to said first and second input signal terminals, that following reception of said differential input signal conduct first and second portions of an NMOS tail current, and
      a third NMOS transistor, coupled to said first and second NMOS transistors, that provides said NMOS tail current; and
   said PMOS input stage includes
      first and second PMOS transistors, coupled to said first and second input signal terminals, that following reception of said differential input signal conduct first and second portions of a PMOS tail current, and
      a third PMOS transistor, coupled to said first and second PMOS transistors, that provides said PMOS tail current.

4. The apparatus of claim 3, further comprising a current mirror circuit, coupled between said first and second power supply terminals, that following reception of a bias current provides first and second bias signals, wherein:
   said third NMOS transistor is coupled to said current mirror circuit and following reception of said first bias signal provides said NMOS tail current; and
   said third PMOS transistor is coupled to said current mirror circuit and following reception of said second bias signal provides said PMOS tail current.

5. The apparatus of claim 3, wherein:
   said PMOS output stage includes first and second PMOS current mirror circuits coupled to said first and second NMOS transistors; and
   said NMOS output stage includes first and second NMOS current mirror circuits coupled to said first and second PMOS transistors.

6. An apparatus including a complementary metal oxide semiconductor (CMOS) differential amplifier circuit, comprising:
   first and second power supply terminals;
   first and second input signal terminals for conveying a differential input signal;
   an output signal terminal for conveying an output signal; and
   a plurality of complementary CMOS differential amplifier circuits, coupled between said first and second power supply terminals and said output signal terminal and coupled in parallel to said first and second input signal terminals, that following reception of said differential input signal provide said output signal;
   wherein:
      said plurality of complementary CMOS differential amplifier circuits forms a plurality of circuit branches and each one of said plurality of circuit branches includes an equal number of CMOS transistors coupled between said first and second power supply terminals;
      said plurality of complementary CMOS differential amplifier circuits comprises:
         a first differential amplifier circuit which includes
            an NMOS input stage coupled between said first and second input signal terminals, and
            a PMOS output stage coupled between said NMOS input stage and said output signal terminal; and
         a second differential amplifier circuit which includes
            a PMOS input stage coupled between said first and second input signal terminals, and
            an NMOS output stage coupled between said PMOS input stage and said output signal terminal;
      said NMOS input stage includes
         first and second NMOS transistors, coupled to said first and second input signal terminals, that following reception of said differential input signal conduct first and second portions of an NMOS tail current, and a third NMOS transistor, coupled to said first and second NMOS transistors, that provides said NMOS tail current; and said PMOS input stage includes first and second PMOS transistors, coupled to said first and second input signal terminals, that following reception of said differential input signal conduct first and second portions of a PMOS tail current, and a third PMOS transistor, coupled to said first and second PMOS transistors, that provides said PMOS tail current;

said PMOS output stage includes first and second PMOS current mirror circuits coupled to said first and second NMOS transistors;

said NMOS output stage includes first and second NMOS current mirror circuits coupled to said first and second PMOS transistors;

said first and second NMOS transistors, following reception of said differential input signal, provide a first differential intermediate signal;

said first PMOS current mirror circuit, following reception of a portion of said first differential intermediate signal, provides a first single-ended intermediate signal;

said second PMOS current mirror circuit, following reception of a second single-ended intermediate signal and another portion of said first differential intermediate signal, provides said output source current as a first portion of said output signal, said first and second PMOS transistors, following reception of said differential input signal, provide a second differential intermediate signal;

said first NMOS current mirror circuit, further coupled to said second PMOS current mirror circuit and following reception of a portion of said second differential intermediate signal, provides said second single-ended intermediate signal; and said second NMOS current mirror circuit, further coupled to said first PMOS current mirror circuit and following reception of said first single-ended intermediate signal and another portion of said second differential intermediate signal, provides said output sink current as a second portion of said output signal.

7. The apparatus of claim 2, wherein:

said PMOS output stage includes a plurality of PMOS current mirror circuits; and said NMOS output stage includes a plurality of NMOS current mirror circuits.

8. The apparatus of claim 2, wherein:

said NMOS input stage, following reception of said differential input signal, provides a first differential intermediate signal;

said PMOS output stage following reception of a portion of said first differential intermediate signal provides a first single-ended intermediate signal, and following reception of a second single-ended intermediate signal and another portion of said first differential intermediate signal provides said output source current of said output signal;

said PMOS input stage, following reception of said differential input signal, provides a second differential intermediate signal; and said NMOS output stage, further coupled to said PMOS output stage, following reception of a portion of said second differential intermediate signal provides said second single-ended intermediate signal, and following reception of said first single-ended intermediate signal and another portion of said second differential intermediate signal provides said output sink current portion of said output signal.

9. An apparatus including a complementary metal oxide semiconductor (CMOS) differential amplifier circuit, comprising:

first and second power supply terminals;

first and second input signal terminals for conveying a differential input signal;

an output signal terminal for conveying an output signal formed by a sum of an output source current and an output sink current;

a first differential amplifier circuit that following reception of said differential input signal provides said output source current as a portion of said output signal and includes an NMOS input stage coupled between said first and second input signal terminals, and a PMOS output stage coupled between said NMOS input stage and said output signal terminal; and a second differential amplifier circuit that following reception of said differential input signal provides said output sink current as another portion of said output signal and includes a PMOS input stage coupled between said first and second input signal terminals, and an NMOS output stage coupled between said PMOS input stage and said output signal terminal;

wherein each one of said output source and sink currents includes both PMOS-origin and NMOS-origin current components generated in response to said differential input signal.

10. The apparatus of claim 9, wherein:

said NMOS input stage includes first and second NMOS transistors, coupled to said first and second input signal terminals, that following reception of said differential input signal conduct first and second portions of an NMOS tail current, and a third NMOS transistor, coupled to said first and second NMOS transistors, that provides said NMOS tail current; and said PMOS input stage includes first and second PMOS transistors, coupled to said first and second input signal terminals, that following reception of said differential input signal conduct first and second portions of a PMOS tail current, and a third PMOS transistor, coupled to said first and second PMOS transistors, that provides said PMOS tail current.

11. The apparatus of claim 10, further comprising a current mirror circuit, coupled between said first and second power supply terminals, that following reception of a bias current provides first and second bias signals, wherein:

said third NMOS transistor is coupled to said current mirror circuit and following reception of said first bias signal provides said NMOS tail current; and said third PMOS transistor is coupled to said current mirror circuit and following reception of said second bias signal provides said PMOS tail current.

12. The apparatus of claim 10, wherein:
said PMOS output stage includes first and second PMOS current mirror circuits coupled to said first and second NMOS transistors; and
said NMOS output stage includes first and second NMOS current mirror circuits coupled to said first and second PMOS transistors.

13. An apparatus including a complementary metal oxide semiconductor (CMOS) differential amplifier circuit, comprising:
first and second power supply terminals;
first and second input signal terminals for conveying a differential input signal;
an output signal terminal for conveying an output signal;
a first differential amplifier circuit that following reception of said differential input signal provides a portion of said output signal and includes
an NMOS input stage coupled between said first and second input signal terminals, and
a PMOS output stage coupled between said NMOS input stage and said output signal terminal; and
a second differential amplifier circuit that following reception of said differential input signal provides another portion of said output signal and includes
a PMOS input stage coupled between said first and second input signal terminals, and
an NMOS output stage coupled between said PMOS input stage and said output signal terminal;
wherein:
said NMOS input stage includes
first and second NMOS transistors, coupled to said first and second input signal terminals, that following reception of said differential input signal conduct first and second portions of an NMOS tail current, and
a third NMOS transistor, coupled to said first and second NMOS transistors, that provides said NMOS tail current;
said PMOS input stage includes
first and second PMOS transistors, coupled to said first and second input signal terminals, that following reception of said differential input signal conduct first and second portions of a PMOS tail current, and
a third PMOS transistor, coupled to said first and second PMOS transistors, that provides said PMOS tail current;
said PMOS output stage includes first and second PMOS current mirror circuits coupled to said first and second NMOS transistors;
said NMOS output stage includes first and second NMOS current mirror circuits coupled to said first and second PMOS transistors;
said first and second NMOS transistors, following reception of said differential input signal, provide a first differential intermediate signal;
said first PMOS current mirror circuit, following reception of a portion of said first differential intermediate signal, provides a first single-ended intermediate signal;
said second PMOS current mirror circuit, following reception of a second single-ended intermediate signal and another portion of said first differential intermediate signal, provides said output source current as said first portion of said output signal;
said first and second PMOS transistors, following reception of said differential input signal, provide a second differential intermediate signal;
said first NMOS current mirror circuit, further coupled to said second PMOS current mirror circuit and following reception of a portion of said second differential intermediate signal, provides said second single-ended intermediate signal; and
said second NMOS current mirror circuit, further coupled to said first PMOS current mirror circuit and following reception of said first single-ended intermediate signal and another portion of said second differential intermediate signal, provides said output sink current as said second portion of said output signal.

14. The apparatus of claim 9, wherein:
said PMOS output stage includes a plurality of PMOS current mirror circuits; and
said NMOS output stage includes a plurality of NMOS current mirror circuits.

15. The apparatus of claim 9, wherein:
said NMOS input stage, following reception of said differential input signals provides a first differential intermediate signal;
said PMOS output stage
following reception of a portion of said first differential intermediate signal provides a first single-ended intermediate signal, and
following reception of a second single-ended intermediate signal and another portion of said first differential intermediate signal provides said output source current as said first portion of said output signal;
said PMOS input stage following reception of said differential input signal, provides a second differential intermediate signal; and
said NMOS output stage, further coupled to said PMOS output stage,
following reception of a portion of said second differential intermediate signal provides said second single-ended intermediate signal, and
following reception of said first single-ended intermediate signal and another portion of said second differential intermediate signal provides said output sink current as said second portion of said output signal.

16. An apparatus including a complementary metal oxide semiconductor (CMOS) differential amplifier circuit, comprising:
first and second power supply means for conveying electrical power;
first and second input signal means for conveying a differential input signal;
output signal means for conveying an output signal formed by a sum of an output source current and an output sink current; and
a plurality of complementary CMOS differential amplifier means, coupled between said first and second power supply means and said output signal means and coupled in parallel to said first and second input signal means, for receiving said differential input signal and thereafter providing said output source and sink currents;
wherein said plurality of complementary CMOS differential amplifier means forms a plurality of circuit branches, each one of said plurality of circuit branches includes an equal number of CMOS transistors coupled between said first and second power supply means, and each one of said output source and sink currents includes both PMOS-origin and NMOS-origin current components generated in response to said differential input signal.

17. The apparatus of claim 16, wherein said plurality of complementary CMOS differential amplifier means comprises:
    first differential amplifier means which includes
        NMOS input means coupled between said first and second input signal means, and
        PMOS output means coupled between said NMOS input means and said output signal means; and
    second differential amplifier means which includes
        PMOS input means coupled between said first and second input signal means, and
        NMOS output means coupled between said PMOS input means and said output signal means.

18. The apparatus of claim 17, wherein:
    said PMOS output means includes a plurality of PMOS current mirror means; and
    said NMOS output means includes a plurality of NMOS current mirror means.

19. The apparatus of claim 17, wherein:
    said NMOS input means is for receiving said differential input signal and thereafter providing a first differential intermediate signal;
    said PMOS output means is for
        receiving a portion of said first differential intermediate signal and thereafter providing a first single-ended intermediate signal, and
        receiving a second single-ended intermediate signal and another portion of said first differential intermediate signal and thereafter providing said output source current as a first portion of said output signal;
    said PMOS input means is for receiving said differential input signal and thereafter providing a second differential intermediate signal; and
    said NMOS output means, further coupled to said PMOS output means, is for
        receiving a portion of said second differential intermediate signal and thereafter providing said second-ended intermediate signal, and
        receiving said first single-ended intermediate signal and another portion of said second differential intermediate signal and thereafter providing said output sink current as a second portion of said output signal.

20. An apparatus including a complementary metal oxide semiconductor (CMOS) differential amplifier circuit, comprising:
    first and second power supply means for conveying electrical power;
    first and second input signal means for conveying a differential input signal;
    output signal means for conveying an output signal formed by a sum of an output source current and an output sink current;
    first differential amplifier means for receiving said differential input signal and thereafter providing said output source current as a portion of said output signal and including
        NMOS input means coupled between said first and second input signal means, and
        PMOS output means coupled between said NMOS input means and said output signal means; and
    second differential amplifier means for receiving said differential input signal and thereafter providing said output sink current as another portion of said output signal and including
        PMOS input means coupled between said first and second input signal means, and
        NMOS output means coupled between said PMOS input means and said output signal means.

21. The apparatus of claim 20, wherein:
    said PMOS output means includes a plurality of PMOS current mirror means; and
    said NMOS output means includes a plurality of NMOS current mirror means.

22. The apparatus of claim 20, wherein:
    said NMOS input means is for receiving said differential input signal and thereafter providing a first differential intermediate signal;
    said PMOS output means is for
        receiving a portion of said first differential intermediate signal and thereafter providing a first single-ended intermediate signal, and
        receiving a second single-ended intermediate signal and another portion of said first differential intermediate signal and thereafter providing said output source current as said first portion of said output signal;
    said PMOS input means is for receiving said differential input signal and thereafter providing a second differential intermediate signal; and
    said NMOS output means, further coupled to said PMOS output means, is for
        receiving a portion of said second differential intermediate signal and thereafter providing said second single-ended intermediate signal, and
        receiving said first single-ended intermediate signal and another portion of said second differential intermediate signal and thereafter providing said output sink current as said second portion of said output signal.

* * * * *

UNITED STATES PATENT AND TRADEMARK OFFICE
CERTIFICATE OF CORRECTION

PATENT NO. : 6,236,269 B1
DATED : May 22, 2001
INVENTOR(S) : Hojabri

Page 1 of 1

It is certified that error appears in the above-identified patent and that said Letters Patent is hereby corrected as shown below:

<u>Column 7,</u>
Line 64, delete "current of said" and replace with -- current as a first portion of said --.

<u>Column 8,</u>
Line 9, delete "current portion" and replace with -- current as a second portion --.

<u>Column 10,</u>
Line 32, delete "stage following" and replace with -- stage, following --.

Signed and Sealed this

Twenty-seventh Day of November, 2001

Attest:

*Attesting Officer*

NICHOLAS P. GODICI
*Acting Director of the United States Patent and Trademark Office*